(12) United States Patent
Shinkai et al.

(10) Patent No.: US 7,572,481 B2
(45) Date of Patent: Aug. 11, 2009

(54) PATTERN FORMING METHOD AND PATTERN FORMING APPARATUS

(75) Inventors: Michinori Shinkai, Yokohama (JP); Satoshi Suzuki, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 790 days.

(21) Appl. No.: 11/014,803

(22) Filed: Dec. 20, 2004

(65) Prior Publication Data

US 2005/0147737 A1 Jul. 7, 2005

(30) Foreign Application Priority Data

Dec. 22, 2003 (JP) ............................. 2003-424991

(51) Int. Cl.
*B05D 5/12* (2006.01)
*C23C 16/52* (2006.01)
(52) U.S. Cl. ..................... 427/97.3; 427/8; 427/97.1; 427/256
(58) Field of Classification Search ............. 427/8, 427/256, 96.1, 97.1, 97.3
See application file for complete search history.

(56) References Cited

U.S. PATENT DOCUMENTS

| 6,561,607 | B1 * | 5/2003 | Lubinsky et al. | ............... 347/8 |
| 6,758,550 | B2 * | 7/2004 | Ito et al. | ....................... 347/40 |
| 6,815,001 | B1 * | 11/2004 | Mishima et al. | ................ 427/8 |

FOREIGN PATENT DOCUMENTS

| JP | 1-303787 | 12/1989 |
| JP | 2-162789 | 6/1990 |
| JP | 4-223390 | 8/1992 |
| JP | 5-211383 | 8/1993 |
| JP | 8-80655 | 3/1996 |

\* cited by examiner

*Primary Examiner*—Brian K Talbot
(74) *Attorney, Agent, or Firm*—Fitzpatrick, Cella, Harper & Scinto

(57) ABSTRACT

A pattern forming method, for laminating a layer of a pattern on a base by supplying to the base a material for forming the pattern from a supply section for supplying the material based on information of the pattern, comprises the step of adjusting a relative positional relation between a forming surface to which the layer of the pattern is formed and the supply section with respect to a direction in which the pattern is laminated, by using the information.

3 Claims, 12 Drawing Sheets

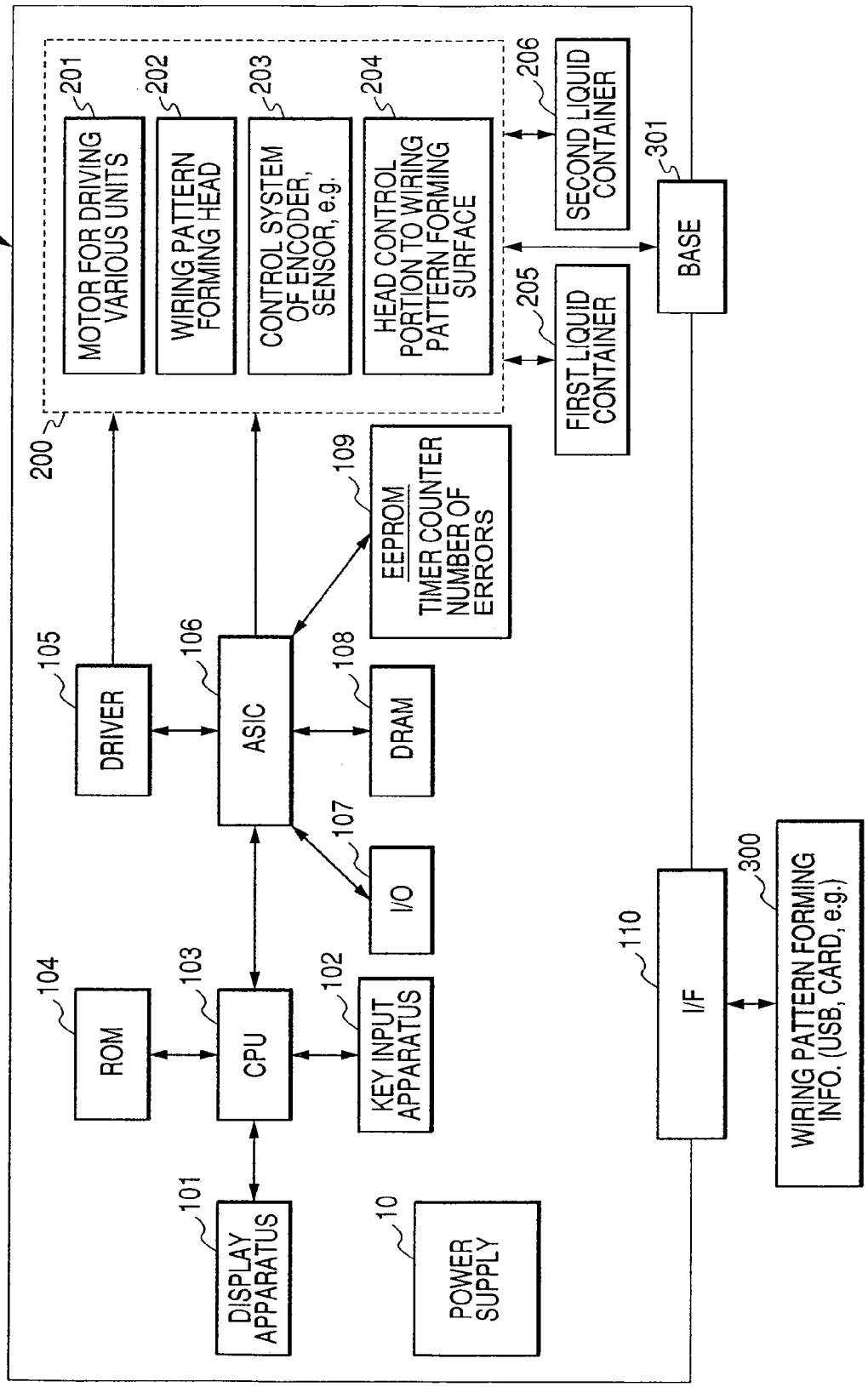

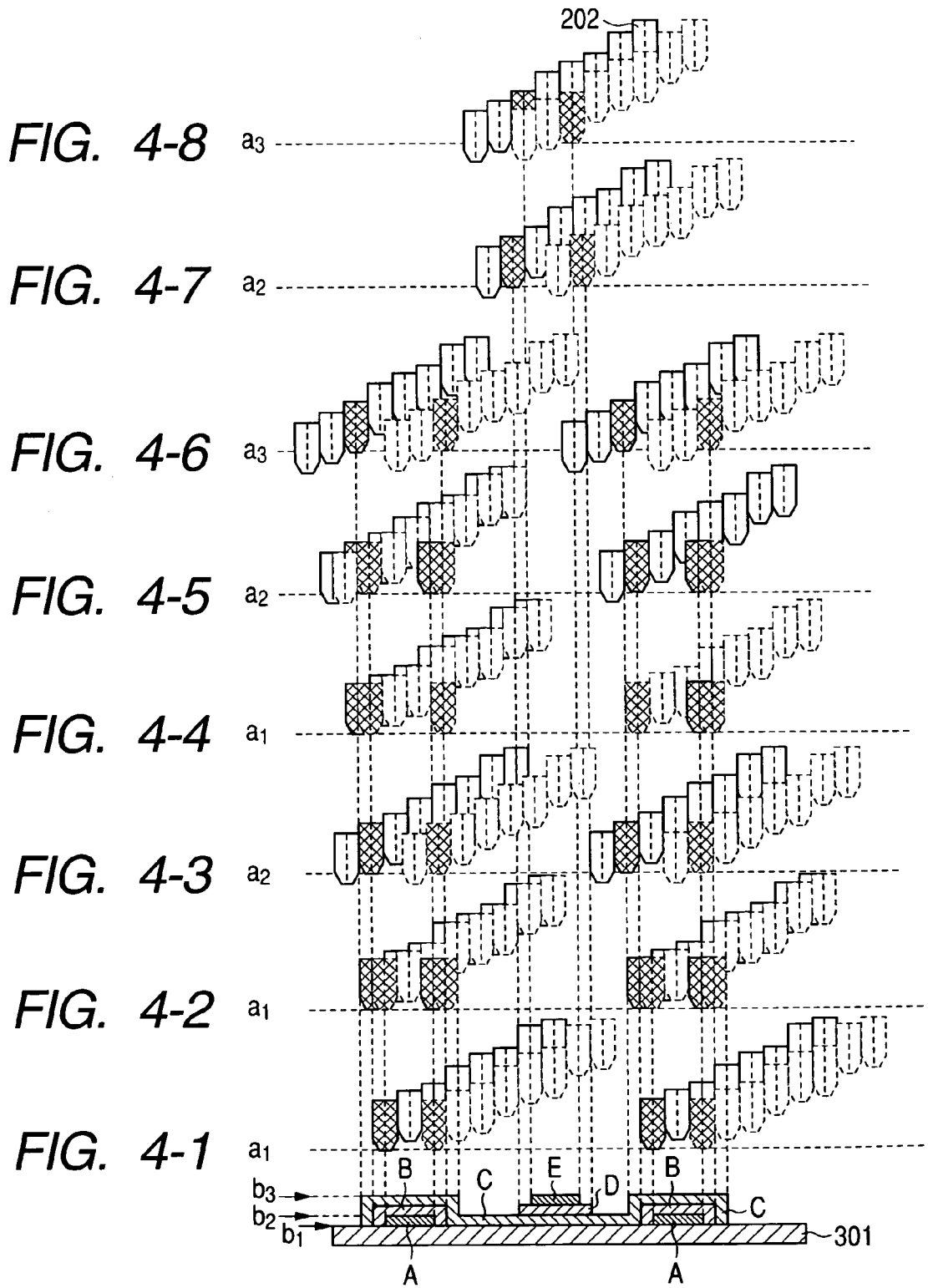

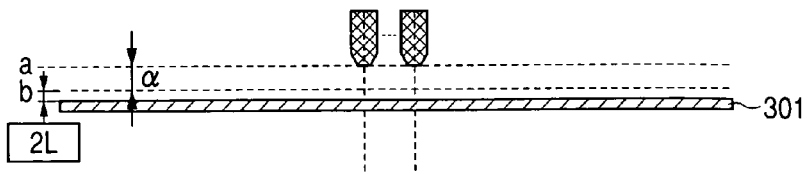
FIG. 6-6
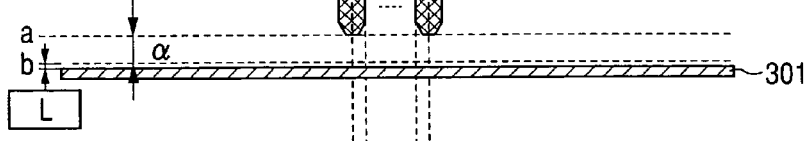
FIG. 6-5
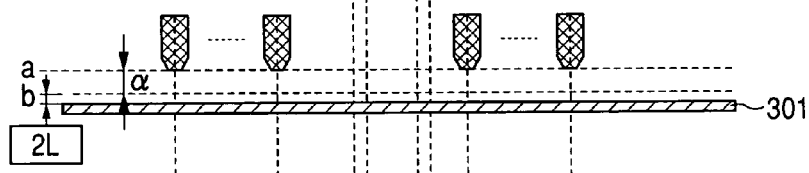
FIG. 6-4
FIG. 6-3
FIG. 6-2
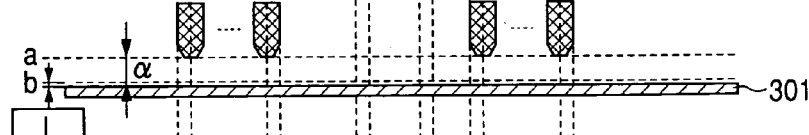
FIG. 6-1
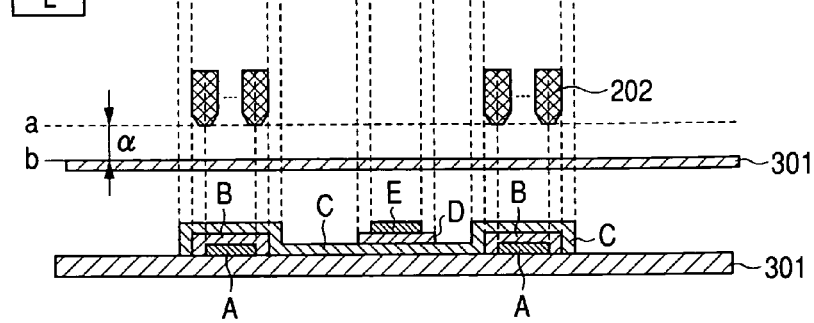

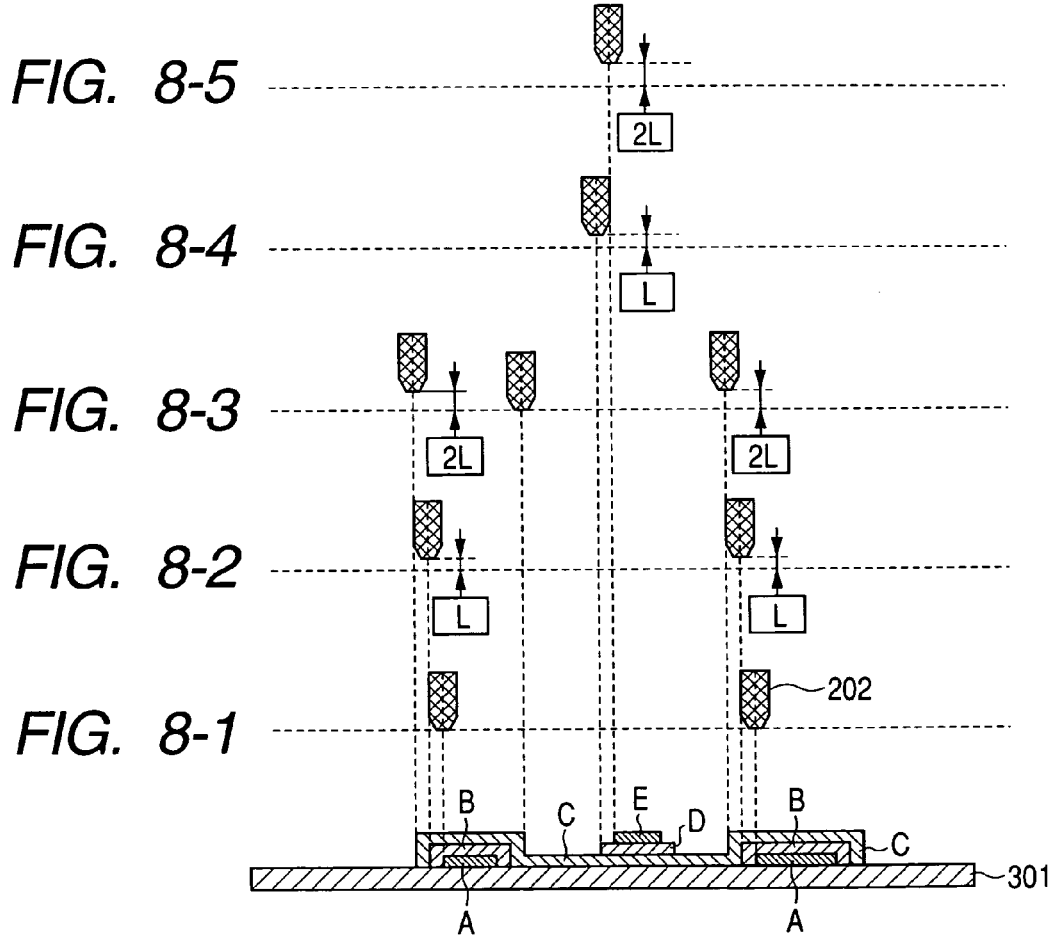

FIG. 10-13
FIG. 10-12
FIG. 10-11
FIG. 10-10
FIG. 10-9
FIG. 10-8
FIG. 10-7
FIG. 10-6
FIG. 10-5
FIG. 10-4
FIG. 10-3
FIG. 10-2
FIG. 10-1
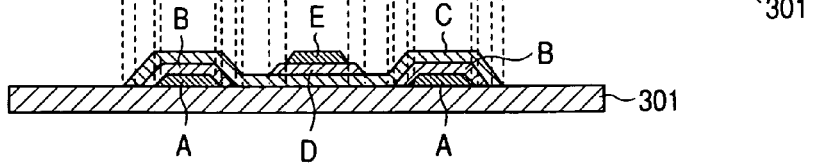

PATTERN FORMING METHOD AND PATTERN FORMING APPARATUS

BACKGROUND OF THE INVENTION

1. Field of the Invention

The present invention relates to a pattern forming method and a pattern forming apparatus for forming a pattern on a base.

2. Related Background Art

In a printer for executing printing by ejecting ink droplets onto a base, it is preferable that a head gap, which is a distance between the base and a recording head, have a constant interval. However, when the base has irregularities, the head gap is not kept constant. Accordingly, there is a possibility that the positions of ink droplets landing on the base are dispersed, and printing quality is deteriorated. Further, in a wiring forming apparatus for forming a wiring pattern by supplying a wiring pattern forming material to a base, it is contemplated that a problem arises in the quality of a wiring pattern formed by the apparatus due to a poor landing (dot placement) accuracy of the wiring pattern forming material.

To solve the above problems, there is disclosed a method of keeping the head gap constant even if a base has irregularities (Japanese Patent Application Laid-Open No. H8-80655).

When a wiring board having a laminated structure is formed using a print apparatus for forming a wiring pattern by supplying a wiring pattern forming material to a base, the pattern forming surface of the base is made irregular because the wiring pattern forming material is repeatedly supplied to the base.

The structure of a print apparatus of a conventional technology copes with the irregularities of the base itself and does not take the heights of substances such as a wiring pattern and the like formed by the print apparatus into consideration.

SUMMARY OF THE INVENTION

An object of the present invention is to provide a reliable pattern forming method having high accuracy and a forming apparatus having a high processing speed which form a pattern having a laminated structure by adjusting the relative positional relation between supply means for supplying a pattern forming material and the pattern formed on a base based on pattern information and improve the landing (dot placement) accuracy of the pattern forming material.

BRIEF DESCRIPTION OF THE DRAWINGS

FIG. 1 is a schematic block diagram showing a system configuration of a wiring pattern forming apparatus for which the present invention is adapted;

FIGS. 2A, 2B and 2C show wiring patterns having a laminated structure for which the present invention can be adopted, in which FIG. 2A is a view of the wiring patterns having the laminated structure when they are viewed from an upper direction, FIG. 2B is a sectional view of the wiring patterns taken along the line 2B-2B of FIG. 2A, and FIG. 2C is a sectional view of the wiring patterns taken along the line 2C-2C of FIG. 2A;

FIGS. 4-1, 4-2, 4-3, 4-4, 4-5, 4-6, 4-7 and 4-8 are views showing wiring pattern forming processes in the example 1 according to the present invention;

FIGS. 5A, 5B and 5C are configuration views when a base receiver is controlled in a height direction in an example 2 according to the present invention, in which FIG. 5A is a configuration view when the base receiver is controlled in the height direction, FIG. 5B is a view showing a state in which the base receiver is located on a lowermost stage, and FIG. 5C is a view showing a state in which the base receiver is located on an uppermost stage;

FIGS. 6-1, 6-2, 6-3, 6-4, 6-5 and 6-6 are views showing wiring pattern forming processes in the example 2 according to the present invention;

FIGS. 7A and 7B are configuration views when a head is controlled in a height direction in an example 3 according to the present invention, in which FIG. 7A is a view of a controller when it is viewed from a lateral direction of a base, and FIG. 7B is a view of the controller when it is viewed from an upper direction of the base;

FIGS. 8-1, 8-2, 8-3, 8-4 and 8-5 are views showing wiring pattern forming processes in the example 3 according to the present invention;

FIGS. 9A, 9B and 9C are configuration views when a head is controlled in a height direction and an oblique direction in an example 4 according to the present invention, in which FIG. 9A is a view when a controller is viewed from a lateral direction of a base, FIG. 9B is a view when the controller is viewed from an upper direction of a base, and FIG. 9C is a view showing the movement of the head in the oblique direction;

FIGS. 10-1, 10-2, 10-3, 10-4, 10-5, 10-6, 10-7, 10-8, 10-9, 10-10, 10-11, 10-12 and 10-13 are views showing wiring pattern forming processes in the example 4 according to the present invention;

FIG. 11 is a flowchart of a program of a wiring pattern forming process for which the present invention can be adopted; and FIG. 12 is a perspective view showing a main portion of a wiring forming apparatus for which the present invention can be adopted.

DETAILED DESCRIPTION OF THE PREFERRED EMBODIMENTS

Through the following examples, a pattern means a wiring pattern, and a leading object of the present invention is to provide a wiring forming apparatus which has a high processing speed, improves a landing accuracy of a wiring pattern forming material, and forms a reliable and accurate wiring pattern by solving the problems of the conventional technology described above by adjusting the relative positional relation between a supply surface onto which a wiring pattern forming material is supplied and a wiring pattern forming surface using wiring pattern forming information (for example, CAD information and the like) corresponding to the irregularities of the wiring pattern forming surface in a process for forming a wiring pattern having a laminated structure.

In the following examples, it is described that a relative positional relation between means for forming the wiring pattern and a wiring pattern layer formed on a base is adjusted on the basis of wiring pattern information.

Adjustment of relative positional relation means control with respect to a direction in which a wiring pattern is laminated on a base; specifically, with respect to a direction vertical to the base (a z-axis direction) in the following examples.

Further, means for forming a wiring pattern means a member affecting an accuracy of wiring pattern due to a change of relative positional relation between the means for forming a wiring pattern and a wiring pattern forming surface. A head for applying liquid to the base is exemplified in the case of an ink jet or a paste application machine.

As a wiring pattern forming apparatus, a paste application machine for supplying to a base a paste-like wiring pattern forming material and an apparatus using an ink jet method are exemplified. A paste application machine is adjusted to discharge paste in use of compressed pressure or a piston. As an ink jet method, a method for discharging liquid from a discharge port of a head by pressure or bubble generated in liquid by applying heat energy to the liquid by a heater arranged in a flow path of head for supplying liquid to the base; a method for discharging liquid from a discharge port of head by driving a piezoelectric element arranged corresponding to a flow path; and the like are exemplified.

The following is an example in which a first liquid for forming an insulation pattern and a second liquid for forming a conductive pattern are used as materials for forming wiring patterns and semiconductor mask information is used as print information for forming the wiring patterns.

Figure 12:
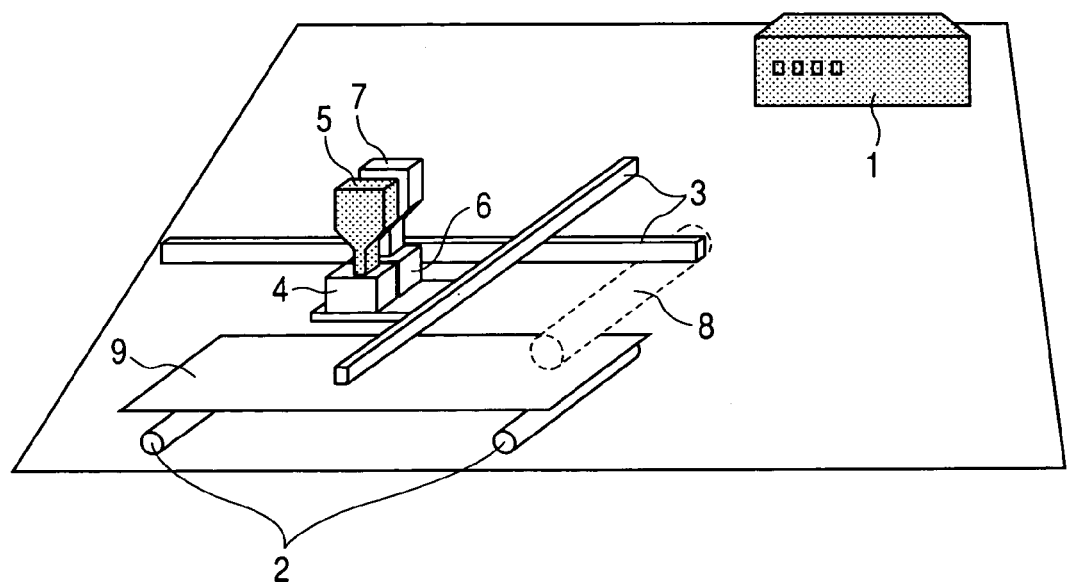

FIG. 12 is a perspective view showing a main portion of a wiring pattern forming apparatus for which the present invention can be adopted.

Wiring patterns are formed by repeating a first process and a second process, and a wiring board is formed by repeating the first and second processes. In the first process, a base transporting unit 2 and a head transporting unit 3 are controlled based on wiring pattern (insulation pattern and/or conductive pattern) forming information instructed from a data processing apparatus 1, and an insulation pattern is formed on a base on a base receiver 9 by ejecting a first liquid in a first liquid container 5 from an insulation pattern forming head 4. In the second process, a conductive pattern is formed on the base by ejecting a second liquid in a second liquid container 7 from a conductive pattern forming head 6. When wirings are formed using the ink jet system, fine wirings having a width of several micron meters to tens of micron meters can be formed. The first liquid for forming the insulation pattern preferably contains an inorganic material such as $SiO_2$, $Al_2O_3$, $TiO_2$, etc. and an organic material such as polyimide, and the like, and the second liquid for forming the conductive pattern preferably contains a metal material such as a solder, Pt, Ag, Au, In, Ga, etc. A heating/curing apparatus 8 has an object of heating and curing the wiring patterns (insulation pattern and/or the conductive pattern) formed on the base or evaporating a solvent by a radiation heat source such as an infrared ray lamp and a xenon lamp. Although heat treatment conditions depend on the curing condition of a component, which can be cured by heat applied thereto, in a wiring pattern forming liquid(s) (first liquid and/or second liquid), the conditions are ordinarily set such that the temperature of the wiring pattern portion of the base is set to 80 to 150° C. When the base is composed of a material that can endure a heat treatment, there can be used a method of heating the base in its entirety by causing a resistive element to come into contact with the base. When there is a possibility that the wiring pattern forming material and the material of the base are deteriorated by the heat treatment, the base or a wiring pattern forming portion is arranged to act also as cooling mechanism. Further, depending on the material of the wiring pattern forming liquids, the wiring pattern forming portion is cured by irradiating light thereto in place of the heat treatment or by both the heat treatment and the irradiation of light. The wavelength of the light to be irradiated is within the range in which a light-curable component in the wiring pattern forming liquid has a practical sensitivity. When a light curing mode is used, a wavelength in an ultraviolet/visible light region of 200 nm to 600 nm is used, and a discharge tube such as a mercury lamp, a xenon lamp, a fluorescent lamp, and the like, for example, are used as a light source.

FIG. 1 is a schematic block diagram showing a system configuration of the wiring pattern forming apparatus for which the present invention can be adopted.

The wiring pattern forming apparatus 100 is composed of a power supply 10, a CPU 103 and an ASIC 106, a ROM 104, a key input apparatus 102, a DRAM 108 as a memory, a display apparatus 101, a wiring pattern forming apparatus driver 105, an I/F 110, and an I/O 107. The CPU 103 and the ASIC 106 control the wiring pattern forming apparatus 100, the ROM 104 stores a program for executing processing through software, the key input apparatus 102 selects an image to be printed, the DRAM 108 converts the controlled state of a head to information when wiring pattern forming information the print of which is instructed is expanded and/or formed, the display apparatus 101 shows the displayed status of the head, and the like to a user, the wiring pattern forming apparatus driver 105 drives a wiring pattern forming apparatus unit 200, the I/F 110 acts as an input port through which wiring pattern information 300, and the like received from the outside is captured, and the I/O 107 controls other inputs and outputs.

The wiring pattern forming apparatus unit 200 is composed of a motor 201, a wiring pattern forming head 202, a control system 203 of an encoder, a sensor, and the like for executing the above control, a controller 204, a first container 205, a second container 206, a base 301, and an EEPROM 109. The motor 201 drives the various units of the wiring pattern forming apparatus 100, the controller 204 controls the upward and downward movement, and the like of the head with respect to a wiring pattern forming surface, the first container 205 stores an insulation pattern forming material, the second container 206 stores a conductive pattern forming material, the base 301 is used to form wiring patterns thereon, and the EEPROM 109 stores information (information of a recovery operation, the remaining amounts of the wiring pattern forming materials, and the like) necessary to control the wiring pattern forming apparatus 100. The information of a wiring pattern to be formed is obtained from the wiring pattern information 300 and temporarily stored in the DRAM 108 acting as storing means through the I/F 110. The information is converted to wiring pattern forming information using a part of the memory area of the DRAM.

The following information is necessary to form wiring patterns:
1) Information of the heights of respective layers;
2) Definition of X- and Y-directions (minimum edge width, minimum interval between lines, and the like);
3) Definition when wirings are overlapped in X- and Y-directions (intervals between overlapped wiring patterns, and the like); and
4) Grid size when wiring patterns are drawn in X- and Y-directions. Wiring patterns are formed based on the above information. That is, when the X- and Y-coordinate values in a main scan direction of a position where a wiring pattern is formed are known, the wiring pattern can be formed.

As to a pattern width, a pattern length, and the like, since the X- and Y-coordinates thereof are previously known as mask information as described above, they are determined using the information.

Figure 11:
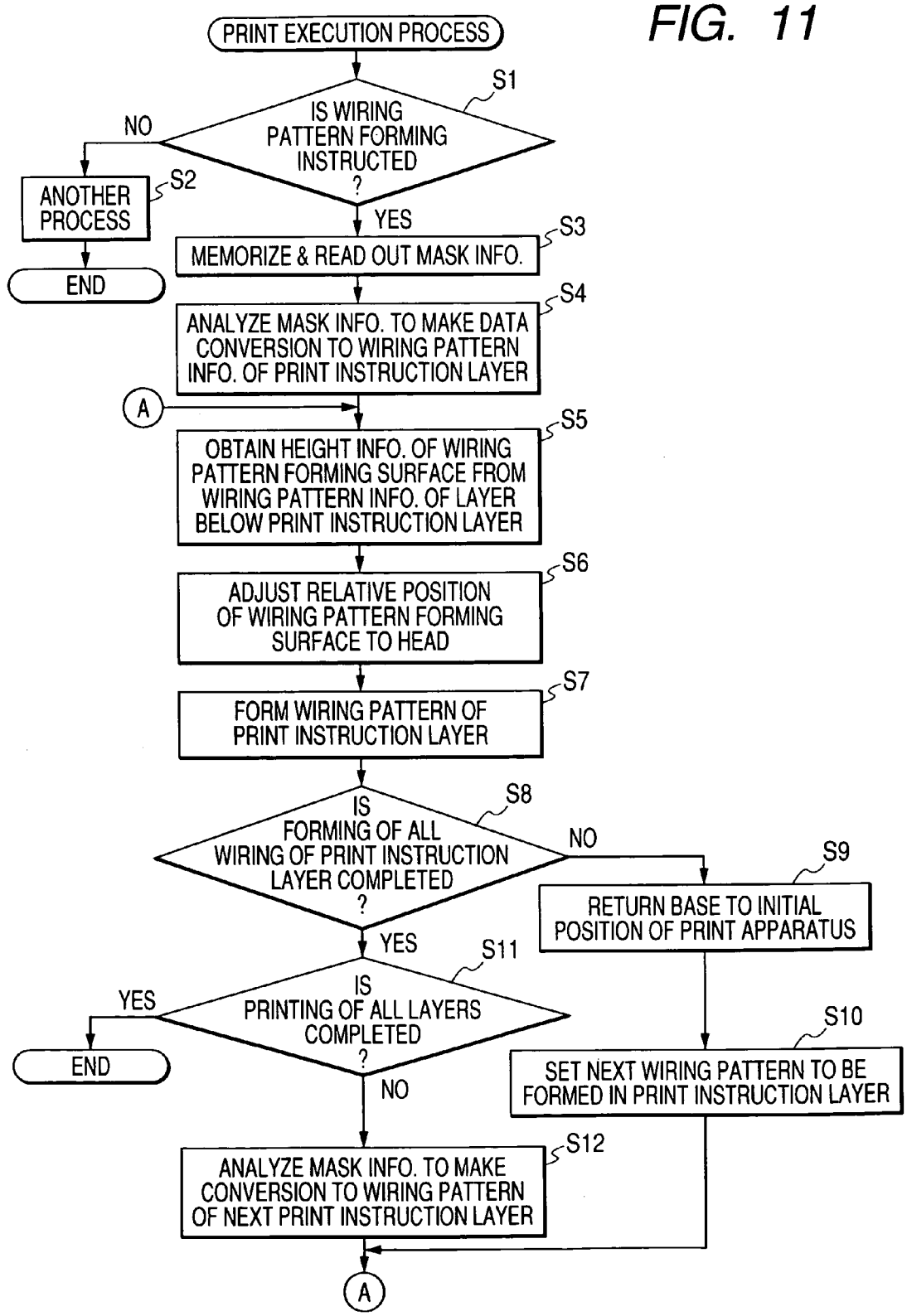

FIG. 11 shows a flowchart of a program of a wiring pattern forming process stored in the ROM 104 shown in FIG. 1. At step S1, it is determined whether wiring pattern forming is instructed. When the wiring pattern forming is not instructed, another process is executed at step S2, and the wiring forming process is finished. Whereas, when the wiring pattern forming is instructed, the data (mask information for printing a semiconductor in the embodiment) the print of which is instructed is read out and stored in a memory at step S3. Height information of wiring pattern is obtained from a table. On the table, that information is made in advance in accordance with conditons such as a material of wiring pattern, a viscosity of wiring pattern, a discharge speed and the like. At step 4, the pattern information of all the layers is analyzed based on obtained mask information to make data conversion to wiring pattern information of each print layer. The information converted here is stored in memory means of a main body, and a wiring pattern is formed based on the wiring pattern information of each print layer. At step S5, the height information of a wiring pattern forming surface is obtained from the wiring pattern information of a layer located below a print instruction layer to be printed and corresponds to a wiring pattern forming surface. A "height" in this context means a height of wiring pattern in a direction in which the wiring pattern layer is laminated. A direction in which the wiring pattern layer is laminated means a direction in which the wiring pattern forming material is supplied. In the following examples, the height means a height with respect to a direction vertical to the base. At step S6, the relative position of the wiring pattern forming surface is adjusted to a head based on the information obtained at steps S4 and S5. At step S7, the wiring pattern of the print instruction layer is formed based on the wiring pattern information of each print layer. At step S8, it is determined whether forming of all the wiring patterns of the print instruction layer is completed. When the forming of all the wiring patterns is completed, the process jumps to step S11. Whereas, when the forming of all the wiring patterns is not completed, the process goes to step S9 at which the base fed in a previous wiring pattern forming process is returned to an initial position at which a print operation starts. At step S10, the information of a next wiring pattern to be formed in the print instruction layer is set, and the process returns to step S5. When a print pattern to be formed remains in another print layer at step S11, the process goes to step S12. At step S12, mask information to be printed next is analyzed to make data conversion to wiring pattern information, and the process goes to step S5. When forming of wiring patterns is completed in all the print layers at step 11, the printing operation is completed.

Figures 2A, 2B, 2C:
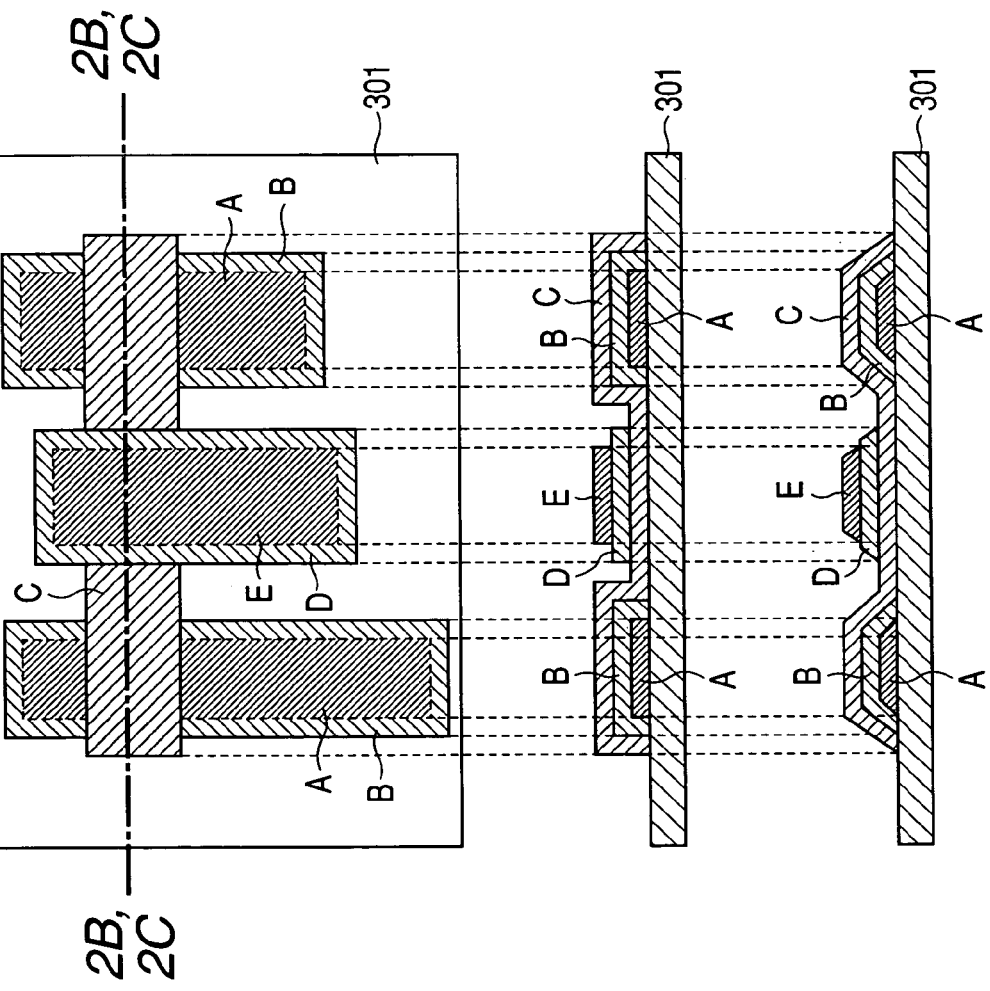

FIG. 2A is view showing wiring patterns having the laminated structure of the present invention. FIGS. 2A to 2C schematically show insulation patterns and conductive patterns so that the laminated structure thereof can be made distinct. Wirings having the laminated structure are formed by laminating insulation patterns and conductive patterns on the base. FIG. 2A shows the wiring patterns having the laminated structure of the present invention when they are viewed from the upper direction of the base. FIG. 2B is a sectional view of the wiring patterns taken along the line 2B-2B of FIG. 2A.

FIG. 2C is a sectional view of the wiring patterns taken along the line 2C-2C of FIG. 2A and shows a case in which the sides of wiring pattern surfaces are formed obliquely in place of vertically due to the viscosity, and the like of wiring pattern forming materials.

In FIGS. 2A to 2C: A shows a longitudinal conductive pattern corresponding to a first mask pattern layer;

B shows a longitudinal insulation pattern corresponding to a second mask pattern layer;

C shows a lateral conductive pattern corresponding to a third mask pattern layer;

D shows a longitudinal insulation pattern corresponding to a fourth mask pattern layer; and E shows a longitudinal conductive pattern corresponding to a fifth mask pattern layer.

Examples 1 to 4 described below will show a sequence for forming wiring patterns having the laminated structure as shown in FIGS. 2A to 2C by adjusting a relative position of a wiring pattern forming surface to a head using the wiring forming apparatus described above.

EXAMPLE 1

Stepwise Structure of Heads

Figure 3:
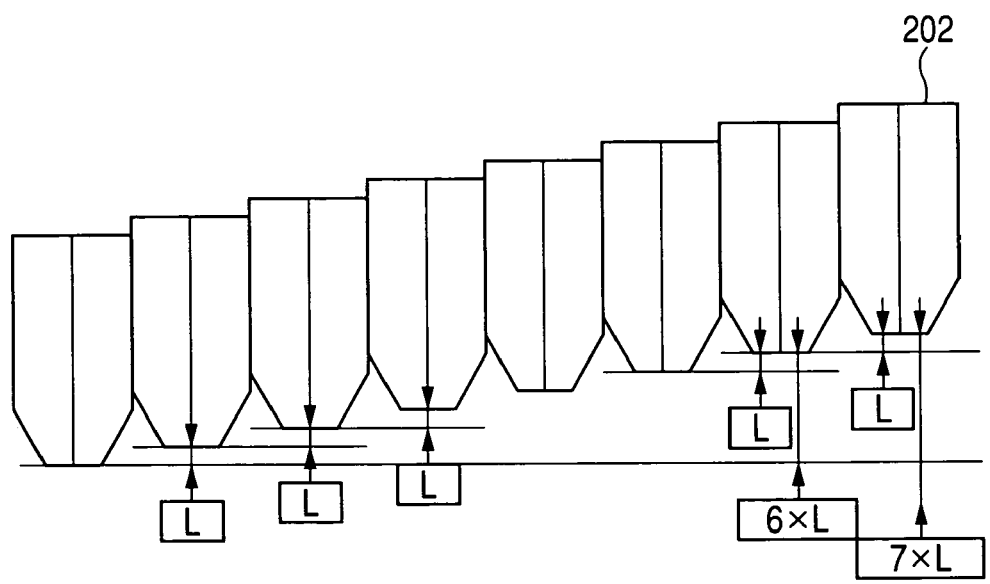
FIG. 3 is a view showing a configuration of wiring pattern forming heads of an example 1 according to the present invention.

FIG. 3 is a view showing a configuration of wiring pattern forming heads disposed stepwise. In FIG. 3, a difference L between the positions of the ejection ports of adjacent heads has a height corresponding to the thickness of one wiring pattern layer formed on a base.

FIGS. 4-1 to 4-8 show processes for forming wirings of the laminated structure shown in FIG. 2B using heads shown in FIG. 3 according to mask pattern information. Wiring patterns are formed by keeping the distances between the ejecting port surfaces a1 to a3 of the heads and wiring pattern forming surface b1 to b3 corresponding to the heads constant.

FIG. 4-1 shows a process for forming conductive patterns A of a first mask pattern layer of a first print layer (wiring pattern layer).

The leftmost heads nearest to the wiring pattern forming surface b1 is used, and a conductive pattern forming material is ejected onto the base while keeping the distance between the ejecting port surfaces a1 of the heads and the wiring pattern forming surface b1 to a constant value.

FIG. 4-2 shows a process for forming insulation patterns B of a second mask pattern layer of the first print layer. An insulation pattern forming material is ejected to both the sides of each conductive pattern A already formed while keeping the distance between the ejecting port surfaces of heads and a wiring pattern forming surface to a constant value.

FIG. 4-3 shows a process for forming insulation patterns B of the second mask pattern layer of a second print layer.

Since wiring patterns are formed on a second print layer, the wiring pattern forming surface b2 is used to form them. The insulation patterns B are formed at predetermined positions on the conductive patterns A using the second heads from a left side, which are displaced upward a distance L corresponding to the thickness of one wiring pattern layer, to keep the distances between the ejecting port surfaces of the heads and the wiring pattern forming surface b2 to a constant value.

FIG. 4-4 shows a process for forming conductive patterns C of a third mask pattern layer of the first print layer.

Parts of the conductive patterns C are formed by ejecting a conductive pattern forming material to both the sides of each insulation pattern B formed already. Since this operation is executed to form wiring patterns on the first print layer, the leftmost heads are used to keep the distance between the ejecting port surfaces a1 of the heads and the wiring pattern forming surface b1 to the constant value.

FIG. 4-5 shows a process for forming conductive patterns C of a third mask pattern layer of the second print layer. Since wiring patterns are formed on the second print layer, the wiring pattern forming surface b2 is used to form them. The second heads from the left side, which are displaced upward the distance L corresponding to the thickness of one wiring pattern layer, are used to keep the distances between the ejecting port surfaces of the heads and the wiring pattern forming surface b2 to the constant value.

FIG. 4-6 shows a process for forming conductive patterns C of the third mask pattern layer of a third print layer. Since wiring patterns are formed on the third print layer, the wiring pattern forming surface b3 is used to form them. Third heads from the left side, which are displaced upward a distance 2L corresponding to the thickness of two wiring pattern layers, are used to keep the distance between the ejecting port surfaces of the heads and the wiring pattern forming surface b3 to a constant value.

FIG. 4-7 shows a process for forming fourth insulation patterns D of a fourth mask pattern layer of the second print layer. Since the insulation patterns D are formed at predetermined positions on the first pattern layers C formed already of the first print layer, the wiring pattern forming surface b2 is used to form them. The second heads from the left side, which are displaced upward the distance L corresponding to the thickness of one wiring pattern layer, are used to keep the distances between the ejecting port surfaces of the heads and the wiring pattern forming surface b2 to the constant value.

FIG. 4-8 shows a process for forming conductive patterns E of a fifth mask pattern layer of the third print layer. Since the conductive patterns E are formed at predetermined positions on the insulation patterns D formed already of the second print layer, the wiring pattern forming surface b3 is used to form them. The third heads from the left side, which are displaced upward the distance 2L corresponding to the thickness of two wiring pattern layers, are used to keep the distances between the ejecting port surfaces of the heads and the wiring pattern forming surface b3 to the constant value. Formation of the wiring patterns having the laminated structure shown in FIG. 2B is completed by the above processes. Since eight print heads are disposed in parallel with each in the head configuration shown in FIG. 3, circuits up to eight layers can be printed. However, it is needless to say that wiring patterns more than eight layers can be formed by increasing the number of the heads.

EXAMPLE 2

Up/Down Movement of Base Receiver

Figure 5A:
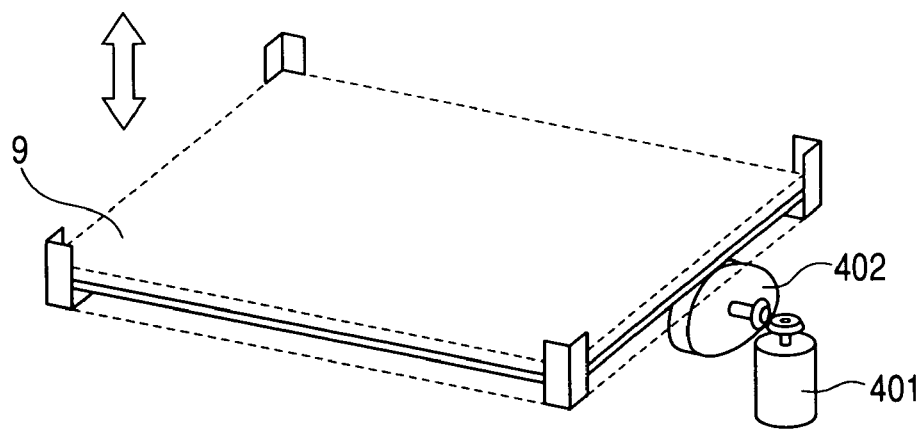
Figure 5B:
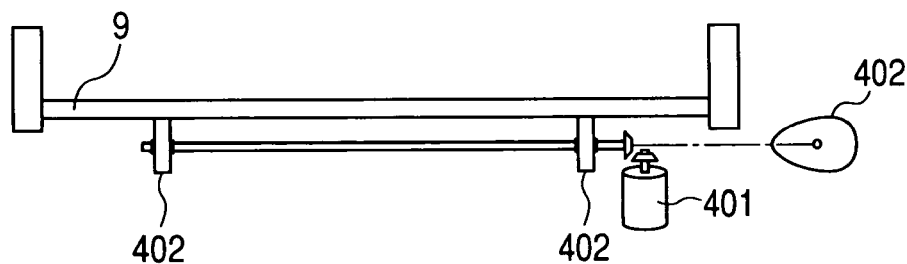
Figure 5C:
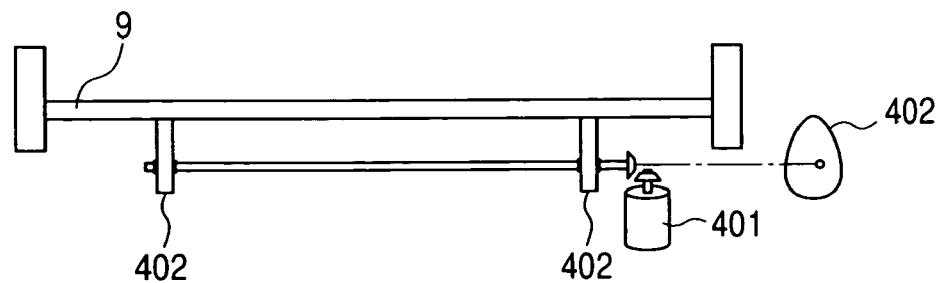

FIGS. 5A to 5C are views showing a height adjusting method of a base receiver 9 as an example of the embodiment of the present invention, in which FIG. 5A is a view explaining a control of a height direction of the base receiver 9, FIG. 5B is a view showing a state in which the base receiver is located at a lowermost position, and FIG. 5C is a view showing a state in which the base receiver is located at an uppermost position. A cam 402 is disposed under the base receiver 9, the base receiver 9 is moved vertically by rotating a motor 401 in correspondence with the thickness of a wiring pattern on a base, thereby the distances between the ejecting port surfaces of heads and a wiring pattern forming surface are kept to a constant value.

FIGS. 6-1 to 6-6 are views showing processes for forming wirings having the laminated structure shown in FIG. 2B using the base receiver shown in FIGS. 5A to 5C.

FIG. 6-1 shows a process for forming conductive patterns A of a first mask pattern layer of a first print layer. The conductive patterns A are formed while keeping the distances between the ejecting port surfaces a of heads and a wiring pattern forming surface b to a constant value $\alpha$.

Next, first print layers of insulation patterns B are formed on both the sides of the conductive pattern A formed already (not shown).

FIG. 6-2 shows a process for forming insulation patterns B of a second mask pattern layer of a second print layer. The distances between the ejecting port surfaces a of the heads and the wiring pattern forming surface b are shortened by the height L of wiring patterns of the first layer. Accordingly, the insulation patterns B are formed after the distances between the heads and the base are adjusted to $\alpha+L$ by moving the base receiver 9 downward by rotating the motor 401 in order to set the distances between the ejecting port surfaces a of the heads and the wiring pattern forming surface b corresponding to the second print layer to $\alpha$.

FIG. 6-3 is a process for forming conductive patterns C of a third mask pattern layer of the first print layer. First print layers of conductive patterns C are formed on both the sides of the insulation patterns B of the first print layer formed already. The conductive patterns C are formed by adjusting the distances a between the ejecting port surfaces a of the heads and the wiring pattern forming surface b to $\alpha$.

Next, conductive patterns C of the third mask pattern of a second print layer are formed on both the sides of the insulation patterns B formed already of the second print layer. The conductive patterns C are formed after the distances between the heads and the base is adjusted to $\alpha+L$ in order to set the distances between the ejecting port surfaces a of the heads and the wiring pattern forming surface b corresponding to the second print layer to $\alpha$ (not shown).

FIG. 6-4 shows a process for forming conductive patterns C of the third mask pattern layer of a third print layer. The conductive patterns C are formed after the distances between the heads and the base is adjusted to $\alpha+2L$ in order to set the distances between the ejecting port surface a of the heads and the wiring pattern forming surface b corresponding to the third print layer to $\alpha$.

FIG. 6-5 shows a process for forming insulation patterns D of a fourth mask pattern layer of the second print layer. The insulation patterns D are formed at predetermined positions on the conductive patterns C formed already of the first print layer. Accordingly, the insulation patterns D are formed after the distances between the heads and the base are adjusted to $\alpha+L$ in order to set the distances between the ejecting port surfaces a of the heads and the wiring pattern forming surface b corresponding to the second print layer.

FIG. 6-6 shows a process for forming conductive patterns E of a fifth mask pattern layer of the third print layer. The conductive patterns E are formed at predetermined positions on the insulation patterns D formed already of the second print layer. Accordingly, the conductive patterns E are formed after the distances between the heads and the base are adjusted to $\alpha+2L$ in order to set the distances between the ejecting port surfaces a of the heads and the wiring pattern forming surface b corresponding to the third print layer.

Formation of the wiring patterns having the laminated structure shown in FIG. 2B is completed by the above processes.

EXAMPLE 3

Up/Down Movement of Head Portion

Figure 7A:
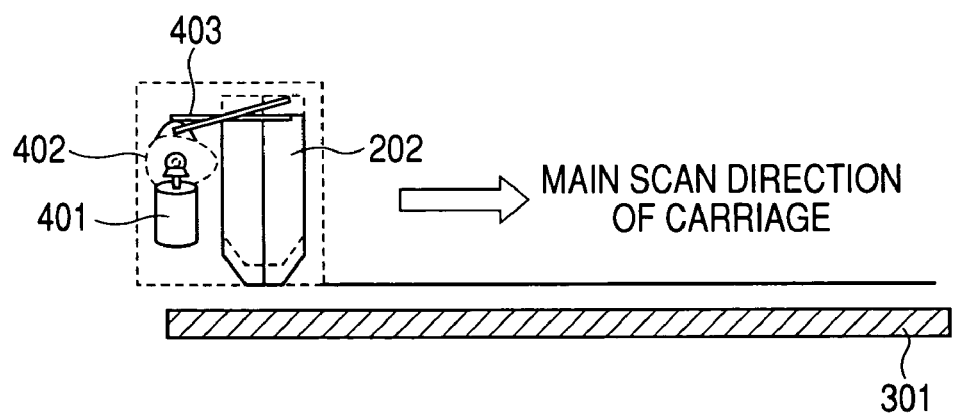
Figure 7B:
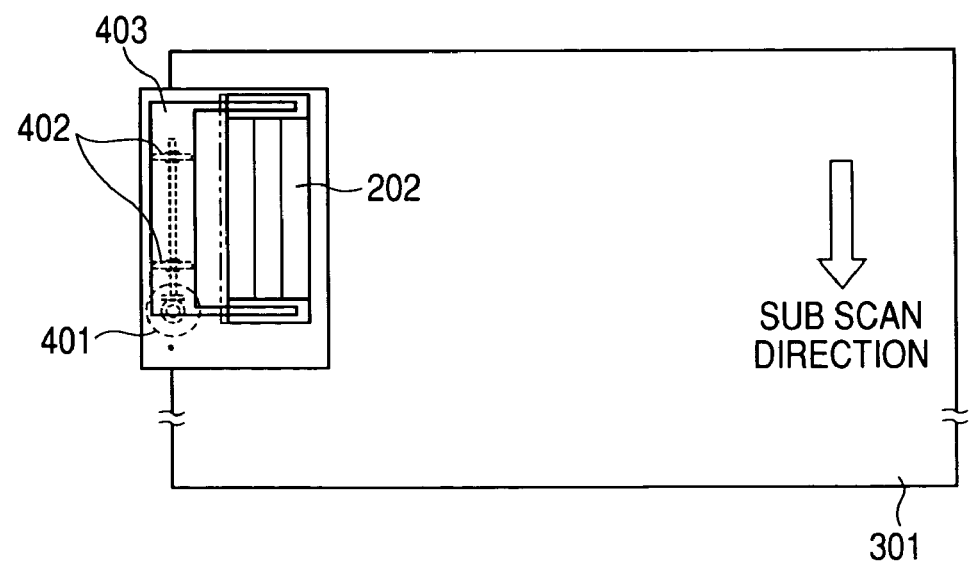

FIGS. 7A and 7B are configuration views when a wiring pattern forming head portion 202 is controlled in a height direction as an example of the embodiment of the present invention. FIG. 7A is a view of a controller when it is viewed from a lateral direction of a base 301. FIG. 7B is a view of the controller when it is viewed from an upper direction of the base 301. The head portion 202 is controlled to move up and down as a method of keeping the distance between the ejecting port surface of the head portion 202 and a wiring pattern forming surface. The head portion 202 is provided with a motor 401 and a cam 402, and the head portion 202 is moved up and down by a spring 403 that is moved up and down by the operation of the cam 402. The motor 401 and the cam 402 are operated in response to information of a print layer on which wiring patterns are to be formed so that the distance between the ejecting port surface of the head portion 202 and the wiring pattern forming surface is set to a constant value α, thereby the ejecting port surface of the head portion 202 is moved up and down.

FIGS. 8-1 to 8-5 are views showing a process for forming wirings having the laminated structure shown in FIG. 2B using the head portion 202 shown in FIGS. 7A and 7B. In the example 3, the head portion 202 is controlled in the up/down direction in place that the base receiver is controlled in the up-down direction in the example 2.

Explanation of the third example is omitted because FIG. 8-1 of the third example corresponds to FIG. 6-1 of the second example, FIG. 8-2 of the third example corresponds to FIG. 6-2 of the second example, FIG. 8-3 of the third example corresponds to FIGS. 6-3 and 6-4 of the second example, FIG. 8-4 of the third example corresponds to FIG. 6-5 of the second example, and FIG. 8-5 of the third example corresponds to FIG. 6-6 of the second example.

EXAMPLE 4

Arrangement for keeping a distance between a head portion and a pattern surface by inclining the head portion When the side surfaces of a formed pattern are not neatly arranged, it is contemplated that accurate wirings cannot be formed by the methods of the examples 1 to 3. Thus, in a fourth example, a head portion that can cope with a case in which a wiring pattern forming surface is an oblique surface will be explained.

Figure 9A:
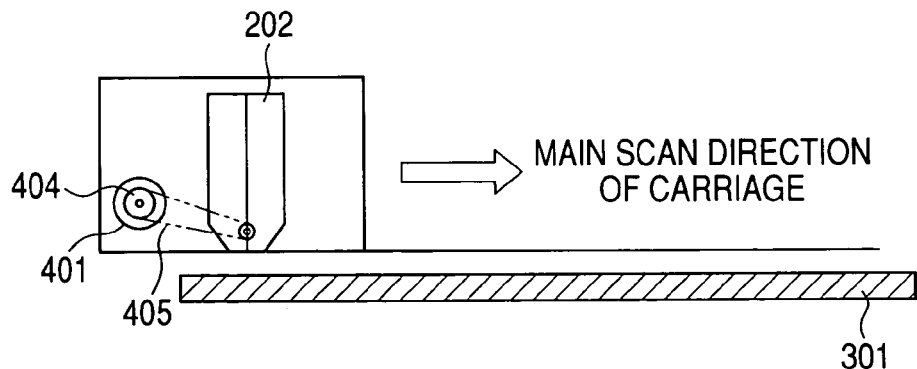
Figure 9B:
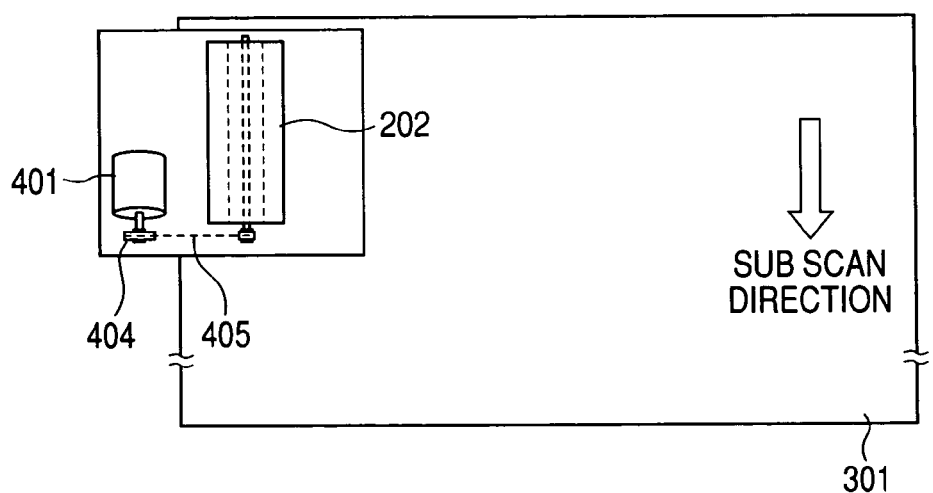
Figure 9C:
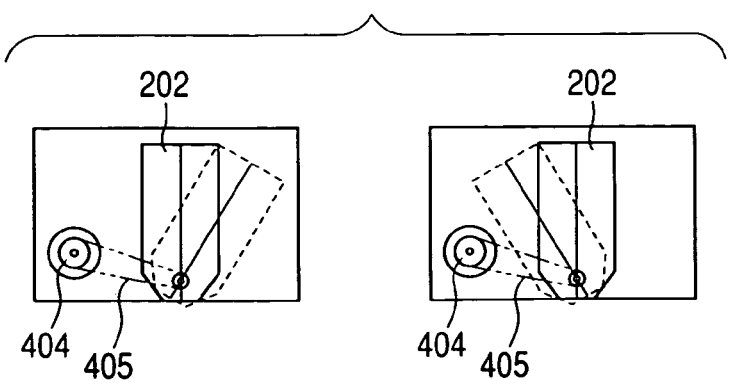

FIGS. 9A to 9C are configuration views when a head portion is controlled in an oblique direction as an example of the embodiment of the present invention, in which FIG. 9A is a view of a controller when it is viewed from a lateral direction of a base 301. FIG. 9B is a view of the controller when it is viewed from an upper direction of the base 301. The head portion is controlled in an up/down direction and in an oblique direction as a method of keeping the distance between the ejecting port surface of a wiring pattern forming head 202 and a wiring pattern forming surface constant. The head 202 is provided with a motor 401, a gear 404, and a belt 405. The flow (tilt) of a wiring pattern forming material on the side surfaces of a formed wiring pattern is predicted from the viscosity, and the like of a wiring pattern forming material. As to the control of the formed wiring pattern in a height direction with respect to the side surfaces, the relation between an increase in height of the wiring pattern and the number of ejected dots of the wiring pattern forming liquid is known and can be read out from the ROM 104 shown in FIG. 1 as a table. Height and tilt information of the head 202 is calculated from the information such as the tilt information of a wiring forming surface, the amount and the number of times of ejection of the wiring pattern forming material, and the like, and the gear 404 is rotated after the rotating angle of the motor 401 is changed. The rotation of the gear 404 is transmitted to the belt 405, and the head 202 is swung as shown in FIG. 9C, thereby a constant distance can be kept between the wiring pattern forming surface and the ejecting port surface of the head 202 in terms of a dot level so that ink droplets can be more accurately ejected. The relation between the rotation of the motor 401 and the tilt of the head 202 is set using a table prepared in the ROM 104 shown in FIG. 1.

FIGS. 10-1 to 10-13 are views showing processes for forming wirings having the laminated structure shown in FIG. 2C using the head 202 shown in FIGS. 9A to 9C. The example 4 shows that the wiring pattern forming material is ejected from the heads 202 to the oblique side surfaces of wiring patterns formed on a base 301 three times so that the ejected material corresponds to the height L of one wiring pattern layer.

FIG. 10-1 shows a process for forming conductive patterns A of a first mask pattern layer of a first print layer. A conductive pattern forming material is ejected to the base 301 while keeping the distance between the ejecting ports of the heads 202 and the wiring pattern forming surface to a constant value. The ejecting port surfaces of the heads 202 are kept in parallel with the base 301.

FIGS. 10-2 to 10-4 and 10-5 to 10-7 show processes for forming insulation patterns B of a second mask pattern of the first print layer. In these processes, a wiring pattern forming material is ejected from the heads 202 to the oblique side surfaces of the wiring patterns A formed in FIG. 10-1 three times so that the ejected material corresponds to the height L of one wiring pattern layer.

FIG. 10-8 corresponds to FIG. 6-2 of the example 2.

FIGS. 10-9 and 10-11 show processes for forming conductive patterns C of a third mask pattern layer of the first print layer and a second print layer. In these processes, the wiring pattern forming material is ejected from the heads 202 to the oblique side surfaces of the wiring patterns B formed in FIG. 10-2 to 10-8 six times, thereby wiring patterns B corresponding to the height 2L of two wiring pattern layers are formed.

FIG. 10-10 corresponds to FIG. 6-4 of the example 2, FIG. 10-12 corresponds to FIG. 6-5 of the example 2, and FIG. 10-13 corresponds to FIG. 6-6 of the example 2.

Formation of the wiring patterns having the laminated structure shown in FIG. 2C is completed by the above processes.

Although the heads 202 described in the example 4 swing in the main scan direction of a carriage, the example 4 can be also applied to heads which swing in a sub scan direction and to heads which swing in both the main and sub scan directions.

EXAMPLE 5

An example in which the head shown in FIG. 4 is employed will be explained. Even if a base is not flat (it has irregularities or is curved), it is possible to form accurate wirings on the base by reading the shape of the base using, for example, a solid image pick-up device head, a scanner, and the like.

For example, if a shape of solid base is known in advance from CAD data or the like, control of head is executed by using data of shape of solid base similarly to control of head by wiring pattern forming information. Upon forming wiring pattern of laminated layers, a sum of information of shape of solid base and height information of wiring pattern is utilized to make head adjustment with respect to a direction (in which a layer is formed) vertical to the base and with respect to a direction oblique to the direction vertical to the base in a manner that a distance between a discharge port surface of head and a wiring pattern forming surface is kept constant in terms of the dot level.

Further, if there is no data of shape of solid base, it may be configured that the head 202 of a controller shown in FIGS. 9A to 9C has the solid image pick-up device head, the scanner, and the like mounted thereon. The solid image pick-up device head is arranged such that a solid image pick-up device, for example, a CCD (charge coupled device), a CMOS sensor, or the like is mounted on a carriage on which an ink jet head is mounted, detects the state of a wiring pattern forming surface formed previously using the same drive mechanism as that of the ink jet head, and stores the coordinate information of the state of the wiring pattern forming surface. Head tilt information is calculated from the detected information, and the gear 404 is rotated after the rotating angle of the motor 401 is changed, thereby the head 202 is swung as shown in FIGS. 9A to 9C so that the distance between the wiring pattern forming surface and the ejecting port surface of the head 202 keeps the constant distance in terms of the dot level, and wiring patterns are formed in this state. The relation between the rotation of the motor 401 and the tilt of the head 202 is set using the table prepared in the ROM 104 shown in FIG. 1. Upon forming a wiring pattern of laminated layer, control can be executed by using a sum of height information of solid base and height information of wiring pattern.

EXAMPLE 6

A thickness L of wiring pattern is approximately 20 μm and a minimum width of pattern is approximately 100 μm.

In case where it is no need to execute control for every single layer with respect to a direction in which the wiring pattern layer is laminated due to a thinness of thickness of wiring patter layer, control may be executed at an interval of a plurality of layers of wring pattern layers with respect to a direction in which a wiring pattern layer is laminated. In this case, an instruction for executing control with respect to the direction in which the wiring pattern layer is laminated is transmitted when information for forming a predetermined number of wiring pattern layers are output. An explanation of control method of head and the base is omitted since it is the same as that of each of the above mentioned examples.

EXAMPLE 7

As mentioned in example 5, an example in which a solid image element, a scanner and the like are mounted to a head of control portion is explained below.

In case where a multi-layer wiring such as more than ten layers is formed, it is fear that an error between a total thickness of wiring pattern actually formed and height information of data might occur with increase in the number of layers. The number of layers of wiring pattern, which is considered to affect an accuracy of wiring pattern is defined as n.

First, wiring pattern data is used for forming a number fewer than n of layers of wiring patterns, similarly to example 5. Next, before forming a wiring pattern of n-th layer in which an error might happen, a total film of wiring pattern is measured by a scanner and calibration is executed to a head. From an n-th layer, a wiring pattern is formed by using wiring pattern data similarly to example 5.

By employing the above-mentioned method, it can be realized that an accuracy of forming of wiring pattern structure of multi-lamination is improved while suppressing lowering of forming speed of wiring pattern to a minimum.

In the examples 1 to 7, it is preferable to execute curing processing each time formation of one wiring pattern layer is completed, for example, to thermally cure the one wiring pattern layer by a heating/curing apparatus 8 shown in FIG. 12. Wiring patterns having a reliable laminated structure can be formed by repeating processing for forming and curing a wiring pattern.

Through each of above examples, a thickness L of wiring pattern is approximately 20 μm and a minimum width of pattern is approximately 100 μm. In the examples described above, the distance between the wiring pattern forming surface and the ejecting port surfaces of the heads is set to the constant value. However, it is also possible to make the printed thickness (height) of an insulation layer different from that of a conductive layer making use of the feature of the head which can be controlled in the height direction with respect to the base. This can be realized by changing the distance between the ejecting port surface of the head and the wiring pattern forming surface by changing the amount of drive of the motor used to move the head portion upward. When, for example, the distance between the ejecting port surface of the head and the wiring pattern forming surface is increased, the wiring pattern forming liquid landing on the base spreads in a range larger than an ordinary range, which is very effective when it is desired to increase the area of a pattern.

Although the above examples describe to execute printing in one direction, the examples are not limited thereto and it is also possible to execute the printing in both directions. Further, although the base is returned to the initial position of the print apparatus by executing a feedback operation each time an instruction pattern is printed to an instruction layer, it is also possible to execute rearward printing from the rear side of the base. It is apparent that the rearward printing can be executed by inversely rotating a feed system motor.

Although it is described in the above embodiments that printing is executed to each instruction mask pattern of an instruction layer. However, after mask information is converted to information of each print layer, the information may be output for each print layer. When portions each having a different height exist within a range in which the head makes scan once, there can be employed such a method that the head ejects the pattern forming material only once to the portion having the height of one layer when the head scans the portion once, the head scans the portion having the height of two layers and ejects the pattern forming material to only the necessary parts of the portion each time it scans the portion, and further the head ejects the pattern forming material to only the necessary parts of a third layer portion three times by the same method.

It is also possible to form a non-contact RFID (radio frequency-identification) chip by forming a coil composed of a conductive pattern and a capacitor composed of a conductive pattern and an insulation pattern. Further, electronic devices such as a transistor, a diode, and the like can be formed by using, as wiring pattern forming materials, semiconductor pattern forming materials containing inorganic materials such as Si, Ge, and the like, and amine, hydrazone, stilbene, star-burst organic materials, and the like, in addition to the conductive pattern forming material and the insulation pattern forming material described above and further using an adhesive layer, and the like for fixing a wiring pattern as necessary. As described above, the present invention can be applied to various purposes within a scope which does not depart from the gist of the present invention.

This application claims priority from Japanese Patent Application No. 2003-424991 filed Dec. 22, 2003, which is hereby incorporated by reference herein.

What is claimed is:

1. A laminated pattern forming method which form patterns on a base by ejecting a pattern forming material from a jet head to the base and then laminating thus formed patterns, said method comprising:

a first step of forming a pattern on the base by scanning the jet head in a plane parallel to a surface of the base;

a second step of adjusting the jet head relative to the surface of the base and forming a pattern on a side surface of the pattern formed on the base, the side surface being tilted relative to the surface of the base; and a third step of adjusting a position of the jet head in a direction perpendicular to the base, in correspondence to a thickness of the pattern formed on the base, and laminating a pattern on the pattern formed on the base in a plane parallel to the surface of the base;

wherein the adjustment of the jet head in the second step is executed using information acquired from the viscosity of the pattern forming material and the adjustment of the jet head in the third step is executed using information acquired from the number of times of ejection by the jet head.

2. A laminated pattern forming method according to claim 1, wherein the adjustment of the head in each of the second step and the third step is executed every time one pattern layer has been formed.

3. A laminated pattern forming method according to claim 1, wherein the adjustment of the head in each of the second step and the third step is executed every time plural pattern layers have been laminated.

* * * * *